(12) United States Patent
Kono

(10) Patent No.: US 11,710,734 B2
(45) Date of Patent: Jul. 25, 2023

(54) CASCODE-CONNECTED JFET-MOSFET SEMICONDUCTOR DEVICE

(71) Applicant: DENSO CORPORATION, Kariya (JP)

(72) Inventor: Kenji Kono, Kariya (JP)

(73) Assignee: DENSO CORPORATION, Kariya (JP)

( * ) Notice: Subject to any disclaimer, the term of this patent is extended or adjusted under 35 U.S.C. 154(b) by 34 days.

(21) Appl. No.: 17/212,621

(22) Filed: Mar. 25, 2021

(65) Prior Publication Data

US 2021/0210484 A1 Jul. 8, 2021

Related U.S. Application Data

(63) Continuation of application No. PCT/JP2019/043294, filed on Nov. 5, 2019.

(30) Foreign Application Priority Data

Nov. 7, 2018 (JP) .................................. 2018-209870

(51) Int. Cl.
*H01L 27/06* (2006.01)
*H01L 29/06* (2006.01)
*H01L 29/808* (2006.01)

(52) U.S. Cl.
CPC ...... *H01L 27/0617* (2013.01); *H01L 29/0607* (2013.01); *H01L 29/808* (2013.01)

(58) Field of Classification Search
CPC ............. H01L 29/7813; H01L 27/0617; H01L 27/2454
See application file for complete search history.

(56) References Cited

U.S. PATENT DOCUMENTS

| | | |
|---|---|---|
| 4,663,547 A | 5/1987 | Baliga et al. |
| 5,406,096 A | 4/1995 | Malhi |
| 6,614,281 B1 | 9/2003 | Baudelot et al. |
| 2011/0199148 A1 | 8/2011 | Iwamura |
| 2014/0225124 A1 | 8/2014 | Otremba et al. |
| 2014/0231829 A1 | 8/2014 | Kanazawa et al. |
| 2014/0231883 A1 | 8/2014 | Esteve et al. |
| 2014/0346570 A1 | 11/2014 | Ueno |
| 2016/0155726 A1 | 6/2016 | Kanazawa et al. |
| 2018/0076317 A1* | 3/2018 | Nakano ............... H01L 29/1095 |
| 2018/0247999 A1* | 8/2018 | Arauchi ............... H01L 29/063 |

FOREIGN PATENT DOCUMENTS

| | | |
|---|---|---|
| JP | 2015-056564 A | 3/2015 |
| JP | 2017-059697 A | 3/2017 |
| WO | 2015/166523 A1 | 11/2015 |

* cited by examiner

*Primary Examiner* — Matthew C Landau
*Assistant Examiner* — Mark Hatzilambrou
(74) *Attorney, Agent, or Firm* — Posz Law Group, PLC

(57) ABSTRACT

A semiconductor device includes a JFET and a MOSFET cascode-connected to each other such that a source electrode of the JFET is connected to a drain electrode of the MOSFET. The JFET is configured such that a breakdown voltage between a gate layer and a body layer is set lower than a breakdown voltage of the MOSFET.

4 Claims, 5 Drawing Sheets

CASCODE-CONNECTED JFET-MOSFET SEMICONDUCTOR DEVICE

CROSS REFERENCE TO RELATED APPLICATIONS

The present application is a continuation application of International Patent Application No. PCT/JP2019/043294 filed on Nov. 5, 2019, which designated the U.S. and claims the benefit of priority from Japanese Patent Application No. 2018-209870 filed on Nov. 7, 2018. The entire disclosures of all of the above applications are incorporated herein by reference.

TECHNICAL FIELD

The present disclosure relates to a semiconductor device in which a junction field effect transistor (hereinafter, simply referred to as JFET) and a metal oxide semiconductor field effect transistor (hereinafter, simply referred to as MOSFET) are cascode-connected.

BACKGROUND

A semiconductor device in which a normally-on type JFET and a normally-off type MOSFET are cascode-connected is known. The JFET is configured by using, for example, a silicon carbide substrate or a gallium nitride substrate, and the MOSFET is configured by using, for example, a silicon substrate.

In such a semiconductor device, when a power supply is connected and a voltage bias is applied, leakage currents occur in the JFET and the MOSFET. However, if the amount of leakage current from the JFET is larger than the amount of leakage current from the MOSFET, the electric charge that cannot flow out is stored in the MOSFET. In the MOSFET, the magnitude of the reverse bias of the PN junction thus increases, resulting in breakdown. Thus, the leakage current of the JFET is allowed to flow due to the breakdown. In this case, the MOSFET is kept in the state of breakdown, so that the gate life may be shortened or the threshold voltage may fluctuate.

In such a configuration, for example, an external bypass resistor may be connected in parallel with the MOSFET. In such a case, since the leakage current of the JFET is discharged also through the bypass resistor, it is possible to suppress the breakdown of the MOSFET.

SUMMARY

The present disclosure describes a semiconductor device including a JFET and a MOSFET that are cascode-connected to each other such that a source electrode of the JFET is connected to a drain electrode of the MOSFET.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
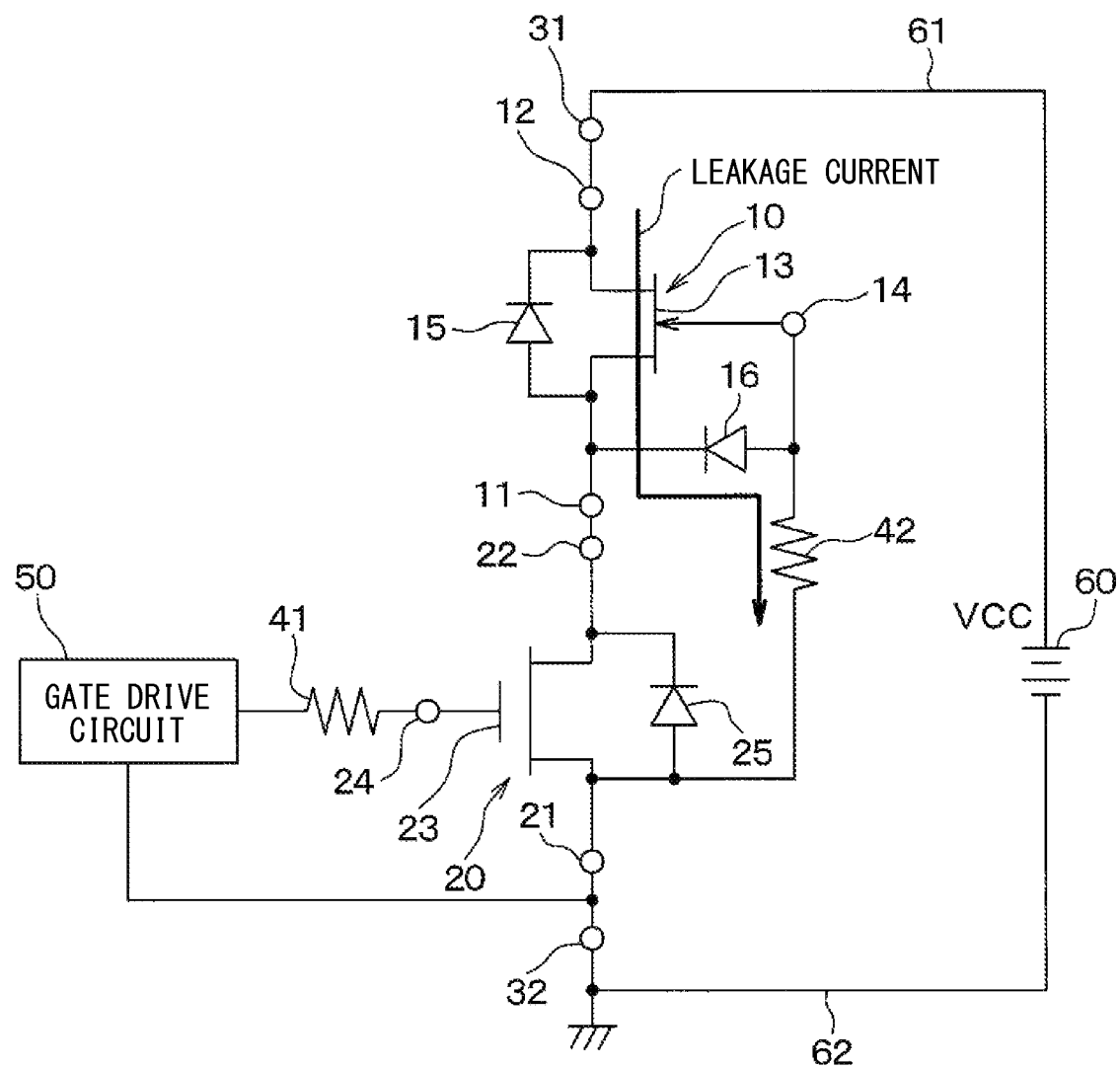
FIG. 1 is a circuit diagram of a semiconductor device, showing a path through which a leakage current flows, according to a first embodiment.

In a semiconductor device in which a normally-on type JFET and a normally-off type MOSFET are cascode-connected, an external bypass resistor may be connected in parallel with the MOSFET to facilitate the leakage current of the JFET to discharge through the external bypass resistor. In such a configuration, however, it may be difficult to perform a characteristic inspection, such as an inspection of the breakdown voltage of the MOSFET, after the semiconductor device is mounted.

According to an aspect of the present disclosure, a semiconductor device includes a JFET and a MOSFET. The JFET includes a source electrode, a drain electrode, and a gate electrode, and the MOSFET includes a source electrode, a drain electrode, and a gate electrode. The JFET and the MOSFET are cascode-connected so that the source electrode of the JFET is electrically connected to the drain electrode of the MOSFET. The JFET includes: a first conductivity type drift layer; a first conductivity type channel layer arranged on the drift layer; a first conductivity type source layer disposed in a surface portion of the channel layer and having an impurity concentration higher than that of the channel layer; a second conductivity type gate layer disposed in the channel layer with a depth deeper than the source layer as the gate electrode; a second conductivity type body layer disposed in the channel layer with a depth deeper than the source layer and separated from the gate layer; a drain layer disposed opposite to the source layer with respect to the drift layer; the source electrode electrically connected to the source layer and the body layer; and the drain electrode electrically connected to the drain layer. A breakdown voltage between the gate layer and the body layer is lower than a breakdown voltage of the MOSFET.

In such a configuration, the breakdown voltage between the gate layer and the body layer is set to be equal to or lower than the breakdown voltage of the MOSFET. Therefore, when a leakage current is generated in the JFET, the leakage current is likely to be discharged through the gate layer before the MOSFET breaks down. Therefore, it is possible to suppress the MOSFET from breaking down. Further, it is possible to inhibit the MOSFET from continuing to break down. In addition, it is not necessary to arrange an external resistor or the like in parallel with the MOSFET, and it is not necessary to concern about the difficultly of the characteristic inspection of the MOSFET after the semiconductor device is mounted.

According to another aspect of the present disclosure, a semiconductor device includes a JFET and a MOSFET. The JFET has a source electrode, a drain electrode, and a gate electrode, and the MOSFET has a source electrode, a drain electrode, and a gate electrode. The JFET and the MOSFET are cascode-connected so that the source electrode of the JFET is electrically connected to the drain electrode of the MOSFET. The MOSFET includes: a first conductivity type drift layer; a second conductivity type channel layer arranged on the drift layer; a first conductivity type source layer disposed in a surface portion of the channel layer and having an impurity concentration higher than that of the drift layer; a gate insulation film disposed on a surface of the channel layer in a region between the source layer and the drift layer; the gate electrode disposed on the gate insulation film; a drain layer disposed opposite to the channel layer with respect to the drift layer; the source electrode electrically connected to the channel layer and the source layer; and the drain electrode connected to the drain layer. The drift layer is formed with crystal defects, so that a leakage current generated in the MOSFET is larger than a leakage current generated in the JFET.

In such a configuration, the MOSFET is formed with the crystal defects, so that the leakage current generated in the MOSFET is larger than the leakage current generated in the JFET. Therefore, it is possible to suppress the MOSFET from breaking down. Further, it is possible to inhibit the MOSFET from continuing to break down. In addition, it is not necessary to arrange an external resistor or the like in parallel with the MOSFET, and it is not necessary to concern about the difficultly of the characteristic inspection of the MOSFET after the semiconductor device is mounted.

Hereinafter, embodiments of the present disclosure will be described with reference to the drawings. In the embodiment described hereinafter, the same or equivalent parts are designated with the same reference numerals.

First Embodiment

A first embodiment will be described. First, the circuit configuration of a semiconductor device of the first embodiment will be described.

As shown in FIG. 1, the semiconductor device of the present embodiment is configured by connecting a normally-on type JFET 10 and a normally-off type MOSFET 20 to form a cascode circuit. In the present embodiment, each of the JFET 10 and the MOSFET 20 is an N channel type device.

The JFET 10 has a source electrode 11, a drain electrode 12, and a gate layer (that is, a gate electrode) 13. The configurations of the JFET 10 will be described later in detail. The MOSFET 20 has a source electrode 21, a drain electrode 22, and a gate electrode 23. The configurations of the MOSFET 20 will be described later in detail.

In the JFET 10 and the MOSFET 20, the source electrode 11 of the JFET 10 and the drain electrode 22 of the MOSFET 20 are electrically connected to each other. The drain electrode 12 of the JFET 10 is connected to a first terminal 31, and the source electrode 21 of the MOSFET 20 is connected to a second terminal 32.

The gate electrode 23 of the MOSFET 20 is connected to a gate drive circuit 50 via a gate pad 24 and an adjustment resistor 41. The gate layer 13 of the JFET 10 is electrically connected to the source electrode 21 of the MOSFET 20 via an adjustment resistor 42 and a gate pad 14.

Figure 3:
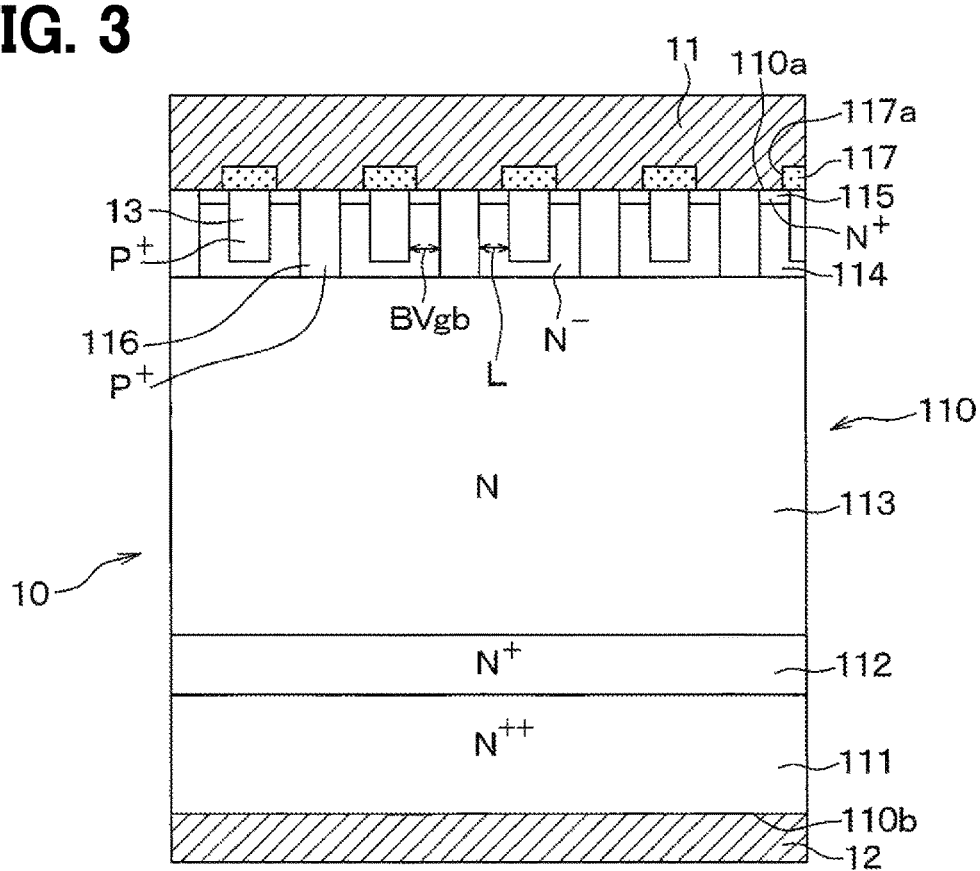
FIG. 3 is a diagram showing a cross-sectional view taken along a line III-III shown in FIG. 2.

In the present embodiment, a diode 15 is connected between the drain electrode 12 and the source electrode 11 of the JFET 10. Although specifically described later, in the present embodiment, the JFET 10 is formed with a P type body layer 116 in an N⁻ type channel layer 114, as shown in FIG. 3. The diode 15 is configured to include the body layer 116. The diode 15 is in a state in which a cathode is electrically connected to the drain electrode 12 and an anode is electrically connected to the source electrode 11.

Further, the body layer 116 is formed in the JFET 10, so that a diode 16 is formed between the gate pad 14 and the source electrode 11. The diode 16 is in a state in which a cathode is connected to the source electrode 11, and an anode is connected to the gate pad 14.

A diode 25 is connected between the drain electrode 22 and the source electrode 21 of the MOSFET 20. The diode 25 is a parasitic diode formed in the configuration of the MOSFET 20, and has a cathode electrically connected to the drain electrode 22 and an anode electrically connected to the source electrode 21.

The semiconductor device according to the present embodiment has the circuit configuration as described hereinabove. In the semiconductor device described above, the first terminal 31 is connected to a power supply line 61 to which the voltage Vcc is applied from a power supply 60, and the second terminal 32 is connected to a ground line 62.

Next, the specific configurations of the JFET 10 and the MOSFET 20 will be described with reference to FIGS. 2 to 5. In the present embodiment, the JFET 10 is formed in a first semiconductor chip 100, and the MOSFET 20 is formed in a second semiconductor chip 200. Although not particularly shown, in the semiconductor device, the first semiconductor chip 100 and the second semiconductor chip 200 are electrically connected so as to form a cascode circuit and integrated into a unit.

Figure 2:
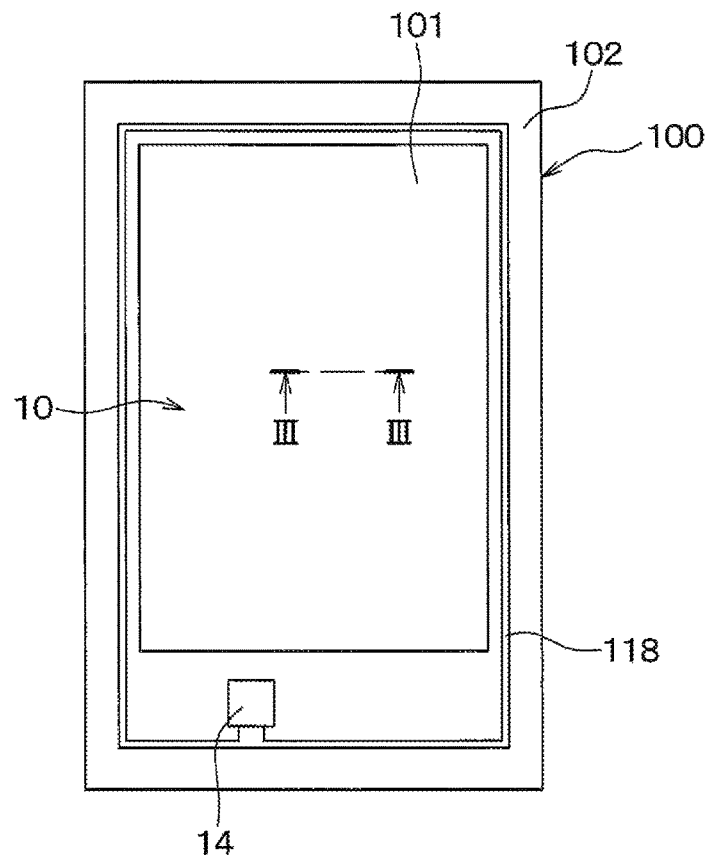
FIG. 2 is a diagram showing a plan view of a first semiconductor chip.

As shown in FIG. 2, the first semiconductor chip 100 has a rectangular shape as a planar shape, and includes a cell region 101 and an outer peripheral region 102 surrounding the cell region 101. The JFET 10 is formed in the cell region 101.

Specifically, as shown in FIG. 3, the first semiconductor chip 100 includes a semiconductor substrate 110. The semiconductor substrate 110 has a drain layer 111 made of an N⁺⁺ type silicon carbide (hereinafter referred to as SiC) substrate. An N⁺ type buffer layer 112 having an impurity concentration lower than that of the drain layer 111 is disposed on the drain layer 111, and an N⁻ type drift layer 113 having an impurity concentration lower than that of the buffer layer 112 is disposed on the buffer layer 112. The buffer layer 112 and the drift layer 113 are formed, for example, by growing an epitaxial film made of SiC on the SiC substrate constituting the drain layer 111.

An N⁻ type channel layer 114 is disposed on the drift layer 113. An N⁺ type source layer 115 having an impurity concentration higher than that of the channel layer 114 is formed in a surface portion of the channel layer 114. The channel layer 114 is formed, for example, by growing an epitaxial film made of SiC, and the source layer 115 is formed, for example, by ion-implanting an N type impurity and performing heat treatment.

Further, a P⁺ type gate layer (that is, the gate electrode) 13 and a P⁺ type body layer 116, each having an impurity concentration higher than that of the channel layer 114, are formed so as to penetrate the source layer 115. The gate layer 13 and the body layer 116 are formed, for example, by the ion implantation or by the growth of a SiC embedded epitaxial film.

In the present embodiment, the gate layers 13 and the body layers 116 extend in one direction (extension direction)

along the planar direction of the semiconductor substrate 110, and are alternately arranged in another direction (arrangement direction) along the planar direction of the semiconductor substrate 110 but orthogonal to the extension direction in which the gate layers 13 and the body layers 116 extend. That is, the gate layers 13 and the body layers 116 extend in the direction perpendicular to the face of the sheet of FIG. 3. Further, the gate layers 13 and the body layers 116 are arranged alternately in the left-right direction of the sheet of FIG. 3, and are arranged apart from each other.

In the present embodiment, the gate layer 13 and the body layer 116 have the same impurity concentration and the same width in the arrangement direction. Further, in the present embodiment, the body layer 116 is formed deeper than the gate layer 13. In other words, the body layer 116 protrudes toward the drain layer 111 more than the gate layer 13.

In the present embodiment, the gate layer 13 and the body layer 116 are configured such that the breakdown voltage BVgb between the gate layer 13 and the body layer 116 is equal to or higher than the threshold voltage of the JFET 10 and is equal to or lower than the breakdown voltage of the MOSFET 20. Note that the threshold voltage of the JFET 10 is a voltage at which the JFET 10 is turned off.

Figure 4:
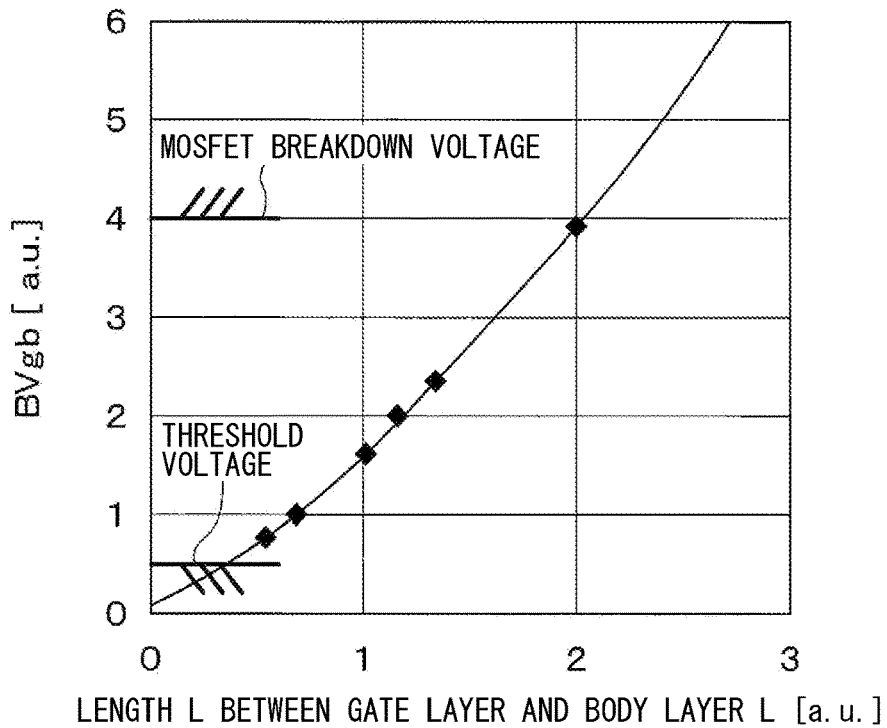
FIG. 4 is a diagram showing a relationship between the length between a gate layer and a body layer in a JFET and a breakdown voltage between the gate layer and the body layer.

As shown in FIG. 4, the breakdown voltage BVgb between the gate layer 13 and the body layer 116 increases as the length L between the gate layer 13 and the body layer 116 increases. In the present embodiment, therefore, the length L between the gate layer 13 and the body layer 116 is set so that the breakdown voltage BVgb between the gate layer 13 and the body layer 116 is equal to or higher than the threshold voltage of the JFET 10 and is equal to or lower than the breakdown voltage of the MOSFET 20. In other words, the length L, that is, a distance between the gate layer 13 and the body layer 116 is set to a predetermined distance so that the breakdown voltage BVgb between the gate layer 13 and the body layer 116 is equal to or higher than the threshold voltage of the JFET 10 and is equal to or lower than the breakdown voltage of the MOSFET 20.

As shown in FIG. 3, an interlayer insulating film 117 is formed on one surface 110a of the semiconductor substrate 110. The interlayer insulation film 117 is formed with a contact hole 117a to expose the source layer 115 and the body layer 116. The source electrode 11 is formed on the interlayer insulating film 117 to be electrically connected to the source layer 115 and the body layer 116 through the contact hole 117a.

The source electrode 11 is formed so as to cover the entire surface of the cell region 101. That is, the source electrode 11 is formed in a so-called solid shape. Therefore, the source electrode 11 has a sufficiently large cross-sectional area as compared with a gate wiring 118 described later. In other words, that the source electrode 11 has a sufficiently larger current capacity than the gate wiring 118 described later.

A drain electrode 12 is formed on the other surface 110b of the semiconductor substrate 110 to be electrically connected to the drain layer 111.

Further, as shown in FIG. 2, the gate pad 14 and the gate wiring 118 are formed in the outer peripheral region 102. The gate wiring 118 is connected to the gate pad 14. Further, the gate wiring 118 is electrically connected to the gate layer 13 in a cross section different from FIG. 3. Although not particularly illustrated, in the outer peripheral region 102, an annular P type well region or a plurality of P type guard rings are formed in the surface portion of the semiconductor substrate 110 so as to have a multiple ring structure surrounding the cell region 101, so that the breakdown voltage is improved.

The first semiconductor chip 100 of the present embodiment has the configurations described hereinabove. In the first semiconductor chip 100 of the present embodiment, the $N^-$ type, N type, $N^+$ type, and $N^{++}$ type correspond to the first conductivity type, and the $P^+$ type corresponds to the second conductivity type. Further, in the present embodiment, as described above, the semiconductor substrate 110 is configured to include the drain layer 111, the buffer layer 112, the drift layer 113, the channel layer 114, the source layer 115, the gate layer 13, and the body layer 116. In the present embodiment, as described above, the drain layer 111 is formed of the SiC substrate, and the buffer layer 112, the drift layer 113, the channel layer 114 and the like are formed by growing the SiC epitaxial film. Therefore, the semiconductor chip 100 of the present embodiment can be referred to as a SiC semiconductor device. In the present embodiment, the first semiconductor chip 100 is provided with the P type body layer 116. Therefore, the diodes 15 and 16 in FIG. 1 are diodes caused by the body layer 116.

Next, the configurations of the second semiconductor chip 200 will be described with reference to FIGS. 5 and 6.

Figure 5:
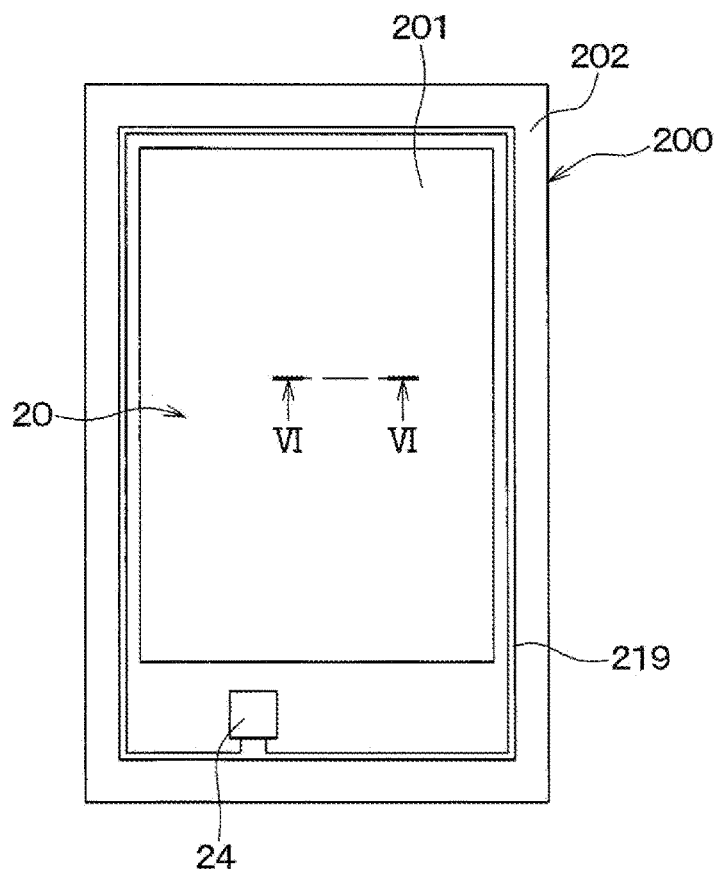
FIG. 5 is a diagram showing a plan view of a second semiconductor chip.

As shown in FIG. 5, the second semiconductor chip 200 has a rectangular shape as a planar shape, and has a cell region 201 and an outer peripheral region 202 surrounding the cell region 201. The MOSFET 20 is formed in the cell region 201.

Figure 6:
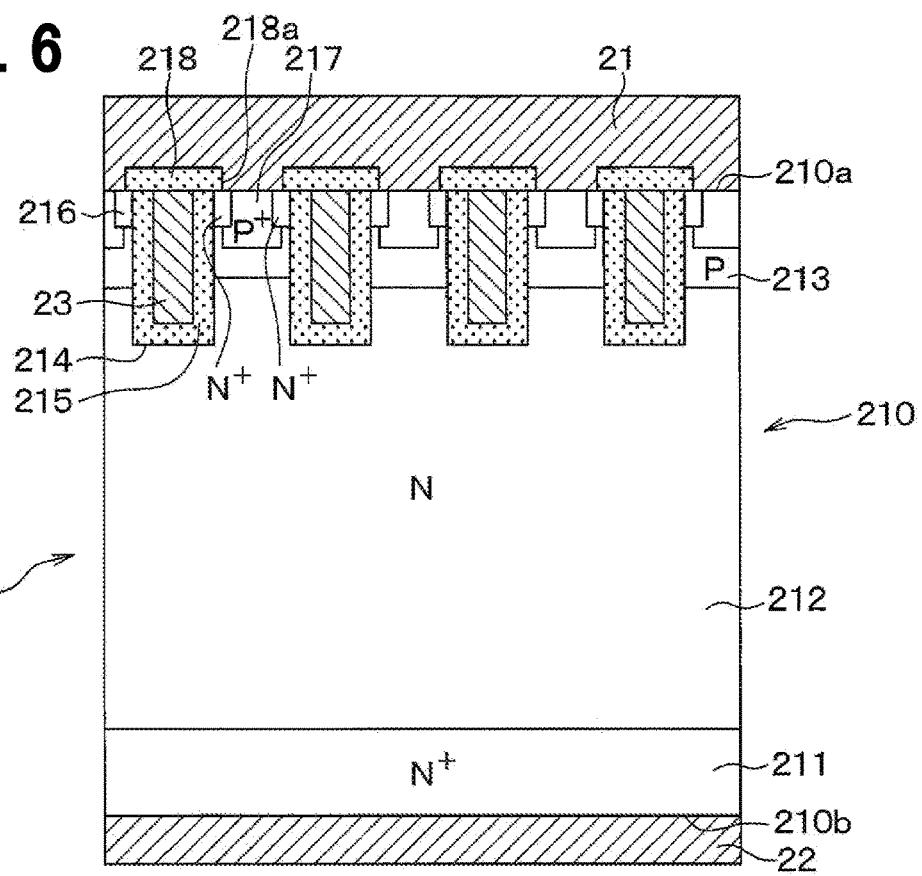
FIG. 6 is a diagram showing a cross-sectional view taken along a line VI-VI shown in FIG. 5.

Specifically, as shown in FIG. 6, the second semiconductor chip 200 includes a semiconductor substrate 210 having a drain layer 211 made of an $N^{++}$ type silicon carbide (hereinafter referred to as SiC) substrate. An $N^-$ type drift layer 212 having an impurity concentration lower than that of the drain layer 211 is disposed on the drain layer 211. A P type channel layer 213 having an impurity concentration higher than that of the drift layer 212 is disposed on the drift layer 212.

In addition, multiple trenches 214 are formed in the semiconductor substrate 210 so as to penetrate the channel layer 213 and reach the drift layer 212, so that the channel layer 213 is separated into multiple portions by the trenches 214. In the present embodiment, the trenches 214 are formed at regular intervals in a stripe manner along one direction of a planar direction of the one surface 210a of the semiconductor substrate 210 (that is, a direction perpendicular to the sheet of FIG. 6). Note that the plurality of trenches 214 may have an annular structure by bending the tip portions thereof.

In each of the trenches 214, a gate insulation film 215 and a gate electrode 23 are embedded. The gate insulation film 215 is formed to cover an inner wall surface of the trench 214, and the gate electrode 23 made of polysilicon or the like is formed on the gate insulation film 215. As a result, a trench gate structure is formed. In the present embodiment, the wall surface of each trench 214 corresponds to the surface of the channel layer 213.

In the channel layer 213, an $N^+$ type source layer 216 and a $P^+$ type contact layer 217 are formed. The $P^+$ type contact layer 217 is interposed between the source layers 216. The source layer 216 has an impurity concentration higher than that of the drift layer 212. The source layer 216 is terminated in the channel layer 213, and is in contact with the side wall of the trench 214. The contact layer 217 has an impurity concentration higher than that of the channel layer 213. The contact layer 217 is terminated in the channel layer 213, similarly to the source layer 216.

To be more specific, the source layer 216 is extended in a bar manner to be in contact with the side wall of the trench 214 along the longitudinal direction of the trenches 214 in a region between adjacent two of the trenches 214, and terminated inside a tip of the trench 214 in its structure. Further, the contact layer 217 is disposed between the two source layers 216 and extends in a rod shape along the longitudinal direction of the trench 214 (that is, the source layer 216). Note that the contact layer 217 of the present embodiment is formed deeper than the source layer 216 with respect to the one surface 210a of the semiconductor substrate 210.

An interlayer insulation film 218 is formed on the channel layer 213 (that is, the one surface 210a of the semiconductor substrate 210). The interlayer insulation film 218 is formed with a contact hole 218a to expose a part of the source layer 216 and the contact layer 217. On the interlayer insulation film 218, the source electrode 21 is formed to be electrically connected to the source layer 216 and the contact layer 217 through the contact hole 218a.

The drain electrode 22 that is electrically connected to the drain layer 211 is formed on the other surface 210b of the semiconductor substrate 210.

Further, as shown in FIG. 5, a gate pad 24 and a gate wiring 219 are formed in the outer peripheral region 202. The gate wiring 219 is electrically connected to the gate electrode 23 in a cross section different from FIG. 6. Although not particularly illustrated, in the outer peripheral region 202, an annular P type well region or a plurality of P type guard rings are formed in the surface portion of the semiconductor substrate 210 so as to form a multiple ring structure surrounding the cell region 201, so that the breakdown voltage is improved.

The second semiconductor chip 200 has the configurations as described hereinabove. In the second semiconductor chip 200 of the present embodiment, the N⁻ type, N type, N⁺ type, and N⁺⁺ type correspond to the first conductivity type, and the P⁺ type corresponds to the second conductivity type. In the present embodiment, as described above, the semiconductor substrate 210 includes the drain layer 211, the drift layer 212, the channel layer 213, the source layer 216, and the contact layer 217. Further, in the present embodiment, since the second semiconductor chip 200 is configured by using the Si substrate as described above, it can be said that the second semiconductor chip 200 is a Si semiconductor device. The MOSFET 20 of the present embodiment has a configuration in which the leakage current is likely to be smaller than that of the JFET 10.

Next, the operation of the semiconductor device of the present embodiment will be described. In the present embodiment, since the semiconductor device includes the MOSFET 20 that is the normally off type device, the semiconductor device operates as a normally off type device as a whole.

First, in order to turn on the semiconductor device by a switching-on operation, a predetermined positive gate voltage is applied to the gate electrode 23 of the MOSFET 20 from the gate drive circuit 50. As a result, the normally-off type MOSFET 20 turns on. In the JFET 10, the gate layer 13 is connected to the second terminal 32. For this reason, the normally-on type JFET 10 turns on because a potential difference between the gate layer 13 and the source electrode 11 is almost zero. Therefore, a current flows between the first terminal 31 and the second terminal 32, and the semiconductor device finally turns on.

Next, in order to turn off the semiconductor device by a switching-off operation, the gate voltage applied to the gate electrode 23 of the MOSFET 20 is reduced (for example, set to 0V). As a result, the normally-off type MOSFET 20 turns off. Further, when the MOSFET 20 turns off, the voltage of the drain electrode 22 of the MOSFET 20 and the voltage of the source electrode 11 of the JFET 10 connected to the drain electrode 22 of the MOSFET 20 increase, and a potential difference is generated between the source electrode 11 and the gate layer 13 of the JFET 10 connected to the second terminal 32. Then, when the potential difference between the source electrode 11 and the gate layer 13 reaches the threshold value, the channel disappears and the JFET 10 turns off. As a result, no current flows between the first terminal 31 and the second terminal 32, and the semiconductor device finally turns off.

In the present embodiment, as described above, the breakdown voltage BVgb between the gate layer 13 and the body layer 116 is equal to or higher than the threshold voltage of the JFET 10 and is equal to or lower than the breakdown voltage of the MOSFET 20. Therefore, when the leakage current is generated in the JFET 10 as the power supply line 61 is connected to the first terminal 31 and the ground line 62 is connected to the second terminal 32, it is possible to suppress the MOSFET 20 from breaking down.

That is, in the present embodiment, as described above, the MOSFET 20 has a configuration in which the leakage current is likely to be smaller than that of the JFET 10. Therefore, in the semiconductor device, when the leakage current is generated in the JFET 10, the leakage current flows into the MOSFET 20 and the reverse bias of the PN junction in the MOSFET 20 increases. In the semiconductor device of the present embodiment, however, the breakdown voltage BVgb between the gate layer 13 and the body layer 116 is lower than the breakdown voltage of the MOSFET 20. Therefore, a breakdown occurs between the gate layer 13 of the JFET 10 and the body layer 116 before the MOSFET 20 breaks down, and thus the leakage current generated in the JFET 10 is also discharged through the gate layer 13. As a result, it is possible to suppress the MOSFET 20 from breaking down, and it is also possible to inhibit the MOSFET 20 from continuing to break down.

The breakdown voltage BVgb between the gate layer 13 and the body layer 116 is set to be equal to or higher than the threshold voltage at which the JFET 10 is turned off. For this reason, when the breakdown occurs between the gate layer 13 and the body layer 116, it is in the state where the channel is not formed in the channel layer 114. Therefore, when the breakdown occurs between the gate layer 13 and the body layer 116, it is possible to suppress the leakage current from flowing into the MOSFET 20 through the channel.

In the present embodiment, since the body layer 116 is provided as described above, when a surge occurs, a surge current can flow through the body layer 116. Therefore, the resistance to the surge current improves, as compared with the case where the body layer 116 is not arranged.

In the present embodiment, the body layer 116 is formed deeper than the gate layer 13. That is, the dimension of the body layer 116 from the one surface 110a of the semiconductor substrate 110 to its bottom surface is greater than the dimension from the one surface 110a to the bottom surface of the gate layer 13. That is, the body layer 116 protrudes from the gate layer 13 toward the drain layer 111. For this reason, the electric field strength is likely to be higher on the bottom side of the body layer 116 than on the bottom side of the gate layer 13. Therefore, when the surge occurs, the breakdown is likely to occur in the region adjacent to the bottom of the body layer 116, and the surge current easily flows into the body layer 116. That is, in the present embodiment, the surge current can flow into the gate wiring 118 and the source electrode 11, and in particular, the surge current can easily flow into the source electrode 11 having a large current capacity through the body layer 116. Therefore, it is possible to inhibit the gate wiring 118 from being blown by the surge, and it is possible to inhibit the first semiconductor chip 100 from being destroyed.

As described above, in the present embodiment, the breakdown voltage BVgb between the gate layer 13 and the body layer 116 is equal to or higher than the threshold voltage of the JFET 10 and is equal to or lower than the breakdown voltage of the MOSFET 20. Therefore, when a leakage current is generated in the JFET 10, the leakage current is likely to be discharged through the gate layer 13 before the MOSFET 20 breaks down. As such, it is possible to suppress the MOSFET 20 from breaking down, and it is also possible to inhibit the MOSFET 20 from continuing to break down. Further, since it is not necessary to arrange an external resistor or the like in parallel with the MOSFET 20, it is possible to suppress the difficulty in performing the characteristic inspection of the MOSFET 20 after mounting the semiconductor device.

Second Embodiment

A second embodiment will be described hereinafter. In the present embodiment, the configuration of the MOSFET 20 is modified from the first embodiment, but the other configurations are the same as those of the first embodiment. Thus, descriptions of the same configurations will not be repeated.

Figure 7:
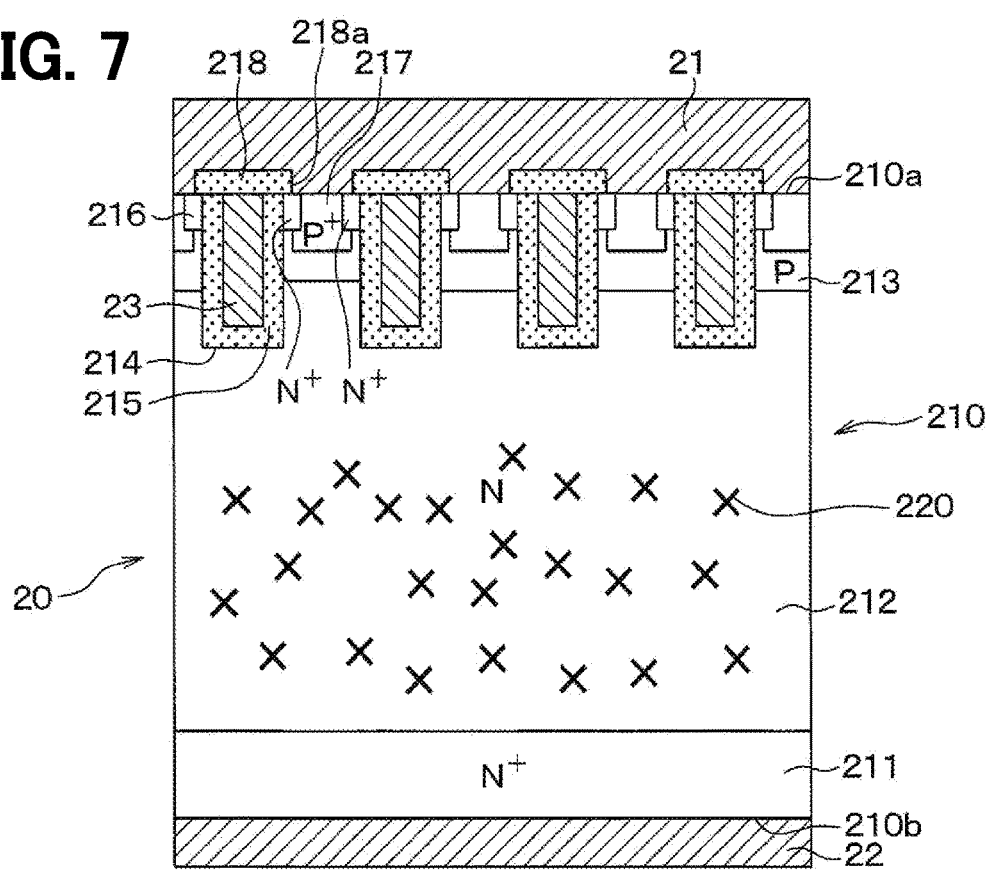
FIG. 7 is a diagram showing a cross-sectional view of a second semiconductor chip according to a second embodiment.

In the present embodiment, as shown in FIG. 7, the MOSFET 20 has a plurality of crystal defects 220 formed in the drift layer 212. In the present embodiment, the crystal defects 220 are formed, for example, by irradiating with helium (He) rays. However, the crystal defects 220 may be formed by another method.

Figure 8:
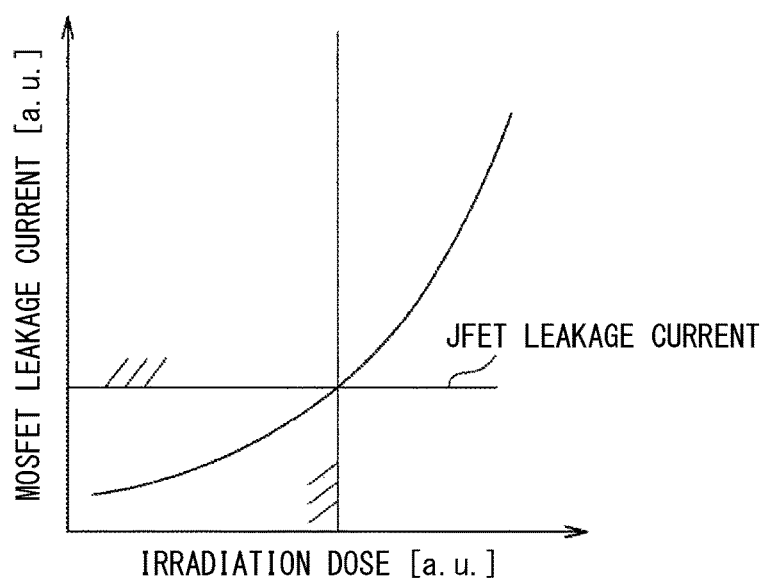
FIG. 8 is a diagram showing a relationship between an irradiation dose and a leakage current of a MOSFET.

As shown in FIG. 8, the irradiation dose of the He rays is adjusted so that the leakage current generated in the MOSFET 20 is larger than the leakage current generated in the JFET 10. That is, the crystal defects 220 are formed so that the leakage current generated in the MOSFET 20 is larger than the leakage current generated in the JFET 10.

In the present embodiment, although not particularly shown, the body layer 116 is not formed in the JFET 10, and the diodes 15 and 16 are not formed in the JFET 10.

The semiconductor device of the present embodiment has the configurations described hereinabove. Next, the leakage current in the semiconductor device will be described.

Figure 9:
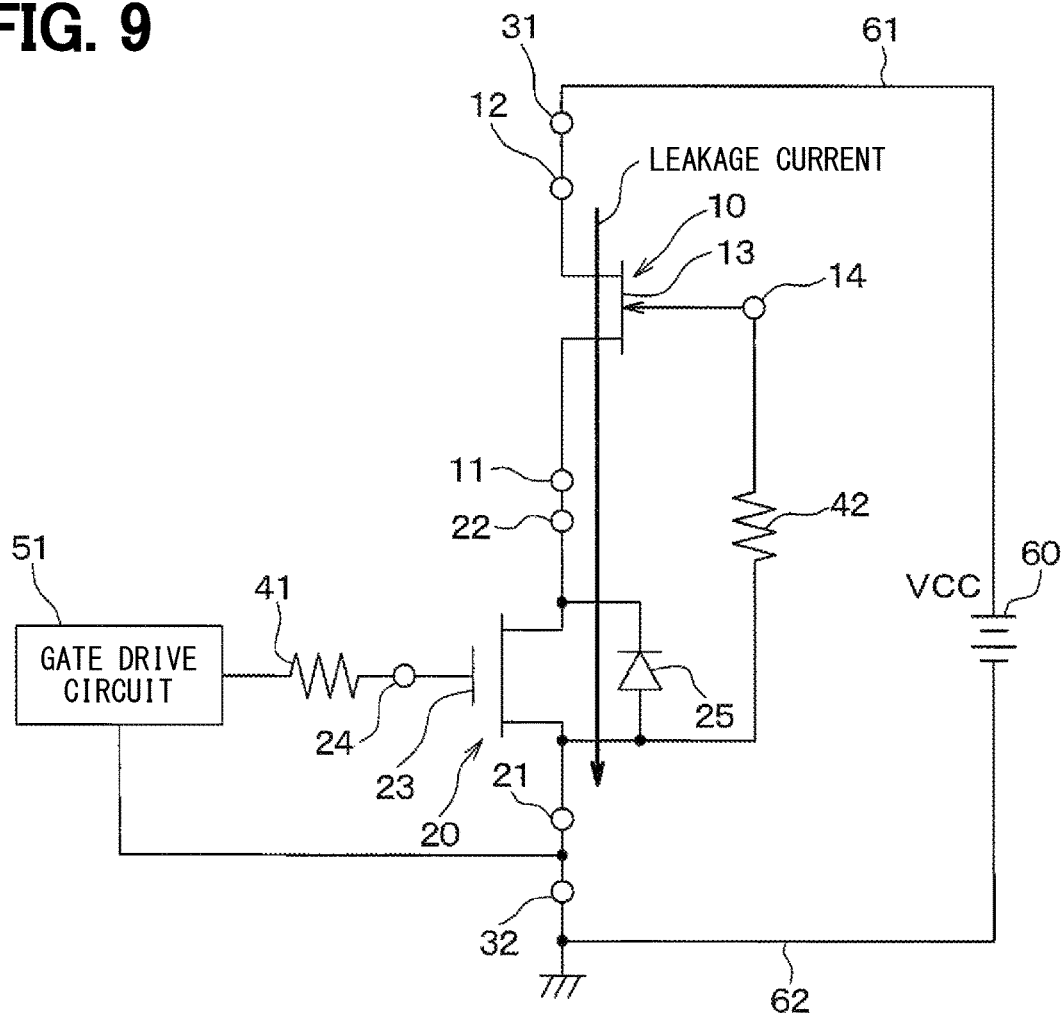
FIG. 9 is a circuit diagram of a semiconductor device, showing a path through which a leakage current flows, according to a second embodiment.

In the present embodiment, the MOSFET 20 is formed with the crystal defects 220 so that the leakage current generated in the MOSFET 20 is larger than the leakage current generated in the JFET 10. Therefore, as shown in FIG. 9, in this semiconductor device, since the leakage current generated in the JFET 10 can be all discharged from the MOSFET 20 to the ground, it is possible to suppress an increase in the reverse bias of the PN junction in the MOSFET 20. As such, in the semiconductor device of the present embodiment, it is possible to suppress the MOSFET 20 from breaking down, and it is also possible to inhibit the MOSFET 20 from continuing to break down.

As described above, in the present embodiment, the crystal defects 220 are formed in the MOSFET 20 so that the leakage current generated in the MOSFET 20 is larger than the leakage current generated in the JFET 10. Therefore, it is possible to inhibit the MOSFET 20 from breaking down, and it is also possible to inhibit the MOSFET 20 from continuing to break down. Further, since it is not necessary to arrange an external resistor or the like in parallel with the MOSFET 20, it is possible to suppress the difficulty in performing the characteristic inspection of the MOSFET 20 after mounting the semiconductor device.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

In each of the embodiments described above, the JFET 10 and the MOSFET 20 may be appropriately P-channel type.

Further, in each of the embodiments described above, the MOSFET 20 has been described as the trench gate type. Alternatively, the MOSFET 20 may be of a planar gate type.

In each of the embodiments described above, the body layer 116 may have the same depth as the gate layer 13. However, when it is configured to allow a large amount of surge current to flow from the body layer 116, it is preferably configured so that the electric field strength is more likely to be higher on the bottom side of the body layer 116 than on the bottom side of the gate layer 13. In such a case, the body layer 116 may be tapered off toward its bottom or the width of the body layer 116 may be narrower than the width of the gate layer 13, so that the electric field strength tends to be higher on the bottom side of the body layer 116 than on the bottom side of the gate layer 13. In addition, the region connected to the bottom surface of the body layer 116 may be an N type region having a higher impurity concentration than the region connected to the bottom surface of the gate layer 13, so that the electric field strength tends to be higher on the bottom side of the body layer 116 than on the bottom side of the gate layer 13.

Further, in the first embodiment, by adjusting the length L between the gate layer 13 and the body layer 116, the breakdown voltage BVgb between the gate layer 13 and the body layer 116 is set to be equal to or higher than the threshold voltage of the JFET 10, and be equal to or less than the breakdown voltage of the MOSFET 20. As another example, the breakdown voltage BVgb between the gate layer 13 and the body layer 116 may be adjusted as follows. For example, the breakdown voltage BVgb between the gate layer 13 and the body layer 116 may be equal to or higher than the threshold voltage of the JFET 10 and equal to or lower than the breakdown voltage of the MOSFET 20 by adjusting the impurity concentration of the channel layer 114 between the gate layer 13 and the body layer 116. In such a case, the breakdown voltage BVgb between the gate layer 13 and the body layer 116 may be adjusted by adjusting both the length L between the gate layer 13 and the body layer 116 and the impurity concentration of the channel layer 114.

Further, the embodiments described above may be combined together. That is, in the second embodiment, the JFET 10 may have a configuration in which the body layer 116 is formed as in the first embodiment. In such a configuration, it is possible to further suppress the MOSFET 20 from breaking down.

In the second embodiment, the MOSFET 20 is inhibited from breaking down due to the crystal defects 220. Therefore, in the case where the JFET 10 is formed with the body layer 116, the body layer 116 may be formed so that the breakdown voltage between the gate layer 13 and the body layer 116 is higher than the breakdown voltage of the MOSFET 20. That is, the body layer 116 of the JFET 10 may be formed mainly for the surge current.

What is claimed is:

1. A semiconductor device comprising:
  a junction field effect transistor (JFET) including a source electrode, a drain electrode, and a gate electrode; and
  a metal oxide semiconductor field effect transistor (MOSFET) including a source electrode, a drain electrode, and a gate electrode,
  wherein the JFET and the MOSFET are cascode-connected so that the source electrode of the JFET is electrically connected to the drain electrode of the MOSFET,
  wherein the JFET includes:
    a first conductivity type drift layer;
    a first conductivity type channel layer disposed on the drift layer;
    a first conductivity type source layer disposed in a surface portion of the channel layer and having an impurity concentration higher than the channel layer;
    a second conductivity type gate layer disposed in the channel layer as the gate electrode and being deeper than the source layer;
    a second conductivity type body layer disposed in the channel layer and being deeper than the source layer, the second conductivity type body layer being separated from the gate layer;
    a drain layer disposed opposite to the source layer with respect to the drift layer;
    the source electrode being electrically connected to the source layer and the body layer; and
    the drain electrode being electrically connected to the drain layer, and
  wherein a breakdown voltage between the gate layer and the body layer is equal to or higher than a threshold voltage of the JFET, and is lower than a breakdown voltage of the MOSFET.

2. The semiconductor device according to claim 1, wherein the body layer is arranged to have a predetermined distance from the gate layer so that the breakdown voltage between the gate layer and the body layer is lower than the breakdown voltage of the MOSFET.

3. The semiconductor device according to claim 1, wherein the MOSFET includes:
  a first conductivity type drift layer;
  a second conductivity type channel layer disposed on the drift layer;
  a first conductivity type source layer disposed in a surface portion of the channel layer and having an impurity concentration higher than that of the drift layer;
  a gate insulation film disposed in the surface portion of the channel layer between the source layer and the drift layer;
  the gate electrode disposed on the gate insulation film;
  a drain layer disposed opposite to the channel layer with respect to the drift layer;
  the source electrode being electrically connected to the channel layer and the source layer; and
  the drain electrode being electrically connected to the drain layer, and
  wherein the drift layer has crystal defects so that a leakage current of the MOSFET is larger than a leakage current of the JFET.

4. The semiconductor device according to claim 3, wherein the crystal defects are manufactured crystal defects.

* * * * *